United States Patent
Arai et al.

(10) Patent No.: US 8,421,116 B2
(45) Date of Patent: Apr. 16, 2013

(54) LIGHT EMITTING DEVICE AND METHOD FOR MANUFACTURING THE SAME

(75) Inventors: Nobutoshi Arai, Osaka (JP); Masatomi Harada, Osaka (JP); Takayuki Ogura, Osaka (JP); Hiroshi Kotaki, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 513 days.

(21) Appl. No.: 12/628,680

(22) Filed: Dec. 1, 2009

(65) Prior Publication Data

US 2010/0140642 A1   Jun. 10, 2010

(30) Foreign Application Priority Data

Dec. 8, 2008 (JP) ................................ 2008-312204
Dec. 8, 2008 (JP) ................................ 2008-312210

(51) Int. Cl.
*H01L 33/00* (2010.01)
(52) U.S. Cl.
USPC .... 257/103; 257/101; 257/102; 257/E33.063; 257/E33.064; 257/E33.065; 257/E33.067; 438/22; 438/37
(58) Field of Classification Search .................. 257/101, 257/102, 103, E33.062–E33.065, E33.067; 438/22, 37
See application file for complete search history.

(56) References Cited

U.S. PATENT DOCUMENTS

| | | | |
|---|---|---|---|
| 6,853,013 B2 * | 2/2005 | Hirai et al. | 257/103 |
| 7,208,768 B2 * | 4/2007 | Ono et al. | 257/79 |
| 2007/0215880 A1 | 9/2007 | Sakata et al. | |
| 2009/0032836 A1 * | 2/2009 | Huh et al. | 257/103 |
| 2010/0026198 A1 * | 2/2010 | Arai et al. | 315/246 |

FOREIGN PATENT DOCUMENTS

| | | |
|---|---|---|
| JP | 7-65959 A | 3/1995 |
| JP | 11-310776 A | 11/1999 |
| JP | 2006-228722 A | 8/2006 |
| JP | 2007-265986 A | 10/2007 |

OTHER PUBLICATIONS

"Latest Trend of Inorganic EL Developments, Material Properties and Fabrication Techniques/Application Expansion", 1st edition, Information Organization, Mar. 27, 2007.
Japanese Office Action dated Mar. 8, 2011 in Japanese Application No. 2008-312210.
Arai et al., "Germanium nanoparticles formation in silicon dioxide layer by multi-energy implantation of Ge negative ions and their photo-luminescence," Materials Science and Engineering B, Switzerland, vol. 147, Feb. 15, 2008, pp. 230-234.
Rebohle et al., "Strong blue and violet photoluminescence and electroluminescence from germanium-implanted and silicon-implanted silicon-dioxide layers," Appl. Phys. Lett., vol. 71, No. 19, Sep. 15, 1997, pp. 2809-2811.

\* cited by examiner

*Primary Examiner* — Kimberly Rizkallah
*Assistant Examiner* — Maria Ligai
(74) *Attorney, Agent, or Firm* — Birch, Stewart, Kolasch & Birch, LLP

(57) ABSTRACT

The light emitting device of the invention comprises a first electrode, a second electrode being light transmitting, and a carrier sandwiched between the first electrode and the second electrode and containing light emitters, wherein the first electrode has a plurality of projections or a pn junction formed with a p-type semiconductor and an n-type semiconductor each on a surface being in contact with the carrier.

15 Claims, 9 Drawing Sheets

LIGHT EMITTING DEVICE AND METHOD FOR MANUFACTURING THE SAME

CROSS-REFERENCE TO RELATED APPLICATION

This application is related to Japanese Patent Application Nos. 2008-312210 filed on Dec. 8, 2008 and 2008-312204 filed on Dec. 8, 2008, whose priorities are claimed under 35 USC §119, and the disclosures of which are incorporated by reference in its entirety.

BACKGROUND OF THE INVENTION

1. Field of the Invention

The invention relates to a light emitting device and a method for manufacturing the same.

2. Description of the Related Art

Inorganic electroluminescent (EL) devices, as self-emitting light sources, have been expected for usage as new display devices or the like with no need of separate illumination sources.

There are two types, "dispersion type" and "thin film type", for conventional EL devices and many of them emit light by an AC operation.

With respect to conventional dispersion type and thin film type EL devices, inorganic EL devices disclosed in Japanese Unexamined Patent Publication No. 2007-265986 and "Latest Trend of Inorganic EL Developments, Material Properties and Fabrication Techniques/Application Expansion, 1st edition, Information Organization, Mar. 27 (2007)" have been developed by using inorganic compounds.

The conventional dispersion type EL devices emit light by phosphor particles with applying an AC voltage to devices containing phosphor particles (e.g. ZnS: Cu, Cl, etc.) shut out of an electric circuit between electrodes. It is supposed that a particle diameter of the phosphor particles is optimum to be about 10 μm and it has been known that if the diameter becomes smaller than 2 to 3 μm, emission luminance is considerably lowered. In this connection, the dispersion type EL devices are supposed to emit light due to donor-acceptor pair recombination.

Further, the conventional thin film type EL devices emit light by light emitting layer with applying an AC voltage to devices having a light emitting layer (e.g. ZnS: Mn; base material ZnS doped with emission center Mn) of a phosphor sandwiched by insulating layers between electrodes. In this connection, the thin film type EL devices are supposed to emit light due to collision excitation of an emission center by hot electrons running in a base material.

On the other hand, techniques of producing a light emitting device on a semiconductor substrate, particularly a silicon substrate, have actively been developed. Since a CMOS circuit, which is an information processor and a storage unit or the like, is manufactured by using a semiconductor including mainly silicon as a base, if a light emitting device could be manufactured simultaneously with other functional devices such as a transistor or the like on a substrate of silicon, etc., the light emitting device could be formed together with the information processor and storage unit on a single substrate. Accordingly, it is highly expected that an inter-chip communication by light and optical computing techniques are made possible and it leads to further developments of digital electronic appliances.

For example, it is known that electroluminescence having a peak at about 650 nm is confirmed by forming fine particles of silicon in a nano-meter order in a silicon nitride film (an insulator) on a silicon substrate and applying a voltage to the silicon nitride film [See Japanese Unexamined Patent Publication No. Hei 11 (1999)-310776].

In addition, with respect to a conventional light emitting device containing fine particles in an insulating film, it is necessary to apply a high voltage between both sides of the insulating film and thus apply an intense electric field of about 7 MV/cm to the insulating film. Accordingly, electrons of electrodes are supplied to a conduction band of the insulating film by FN (Fowler-Nordheim) tunneling and after being accelerated in the electric field to have sufficient kinetic energy, the electrons collide against the fine particles. The collided electrons excite electrons of the fine particles and the excited electrons are supposed to emit light.

However, there is a problem that the conventional light emitting device in which fine particles are formed in an insulating film unevenly emits light.

SUMMARY OF THE INVENTION

In view of the above state of the art, it is an object of the invention to provide a light emitting device capable of evenly emitting light.

A light emitting device of the invention includes a first electrode, a second electrode being light transmitting, and a carrier formed between the first electrode and the second electrode and containing light emitters, wherein the first electrode has a plurality of projections or a pn junction formed with a p-type semiconductor and an n-type semiconductor each on a surface being in contact with the carrier.

According to the light emitting device of the invention, the surface of the first electrode being in contact with the carrier can be provided with the plurality of projections so as to evenly distribute a shorter portion of a distance between the first electrode and the second electrode. Thereby, electricity can be selectively conducted through the carrier between the plurality of projections and the second electrode, so that the light emitters contained within the carrier between the plurality of projections and the second electrode can selectively emit light. Hereby, the light emitting device can evenly emit light.

Further, according to the light emitting device of the invention, the surface of the first electrode being in contact with the carrier can be provided evenly with a pn junction formed with the p-type semiconductor and the n-type semiconductor. Thereby, electricity is selectively conducted through the carrier between the pn junction and the second electrode, so that the light emitters contained within the carrier between the pn junction and second electrode can selectively emit light. Hereby, light emitting device can evenly emit light.

DESCRIPTION OF PREFERRED EMBODIMENTS

1. First Embodiment

A light emitting device of a first embodiment comprises a first electrode, a light transmitting second electrode, and a carrier formed between the first electrode and the second electrode and containing light emitters in the inside thereof, wherein the first electrode has a plurality of projections on a surface being in contact with the carrier and a distance between upper ends of the projections and the second electrode is shorter than a distance between parts of the first electrode other than the projections and the second electrode.

Figure 11:
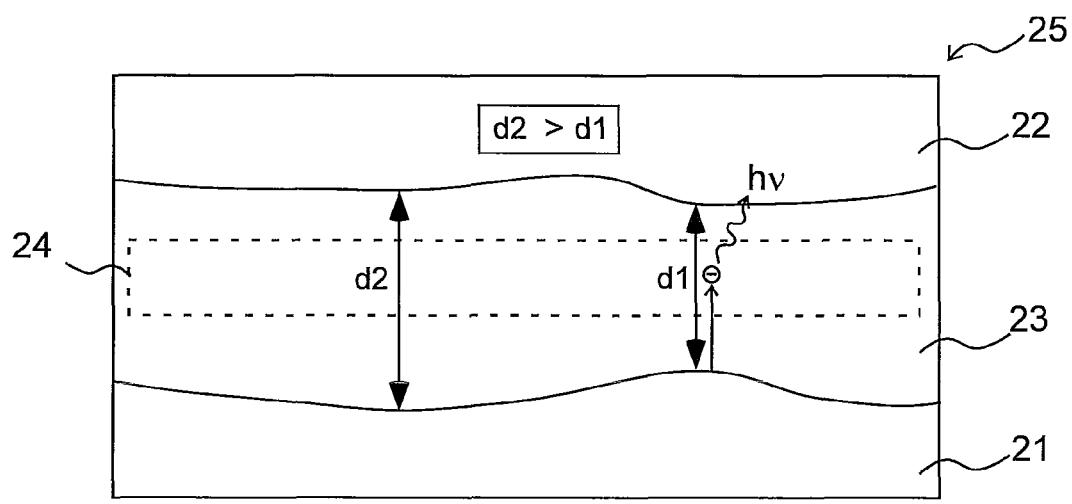
FIG. 11 is a schematic cross-sectional view of a conventional light emitting device in which fine particles are formed in an insulating film.

The investigation by the present inventors found that a reason of unevenness of emission in a conventional light emitting device in which light emitters are formed in an insulating film is because a distance between electrodes is not even. It will be described with reference to drawings. FIG. 11 is a schematic cross-sectional view of a conventional light emitting device in which phosphors as light emitters are dispersed in a light emitting region 24 in an insulating film 23. As shown in FIG. 11, in the case of a conventional light emitting device 25, a distance between a silicon substrate 21 and an ITO electrode 22 is uneven. It is caused by slight curves and scratches of a surface of the silicon substrate 21 and the insulating film 23 and a formation state of the ITO electrode 22. That is, parts with a distance d1 and a distance d2 (d2>d1) are formed between the silicon substrate 21 and the ITO electrode 22. In this case, when a voltage is applied between the silicon substrate 21 and the ITO electrode 22 and thus an electric field with an intensity as high as about 7 MV/cm is applied to the insulating film 23, electrons are intensively concentrated in parts with a shorter distance between the substrate 21 and the ITO electrode 22, that is, the parts with d1 and the emission is supposed to be strong as compared with other parts. Further, in parts with a longer distance between the substrate 21 and the ITO electrode 22, that is, the parts with d2, electrons are hard to be supplied and thus the parts are supposed to emit no light or merely slight light. Therefore, it is supposed that the emission is uneven in the conventional light emitting device 25.

Investigations on a method for eliminating unevenness of the emission have been carried out and, accordingly, it have been found that if a light emitting device is manufactured such that parts with a short distance between electrodes in both sides of an insulating film are distributed evenly, electrons can be supplied selectively to these parts and thus these parts are selectively enabled to emit light.

It will be described with reference to FIGS. 1A, 1B and 1C.

Figure 1A:
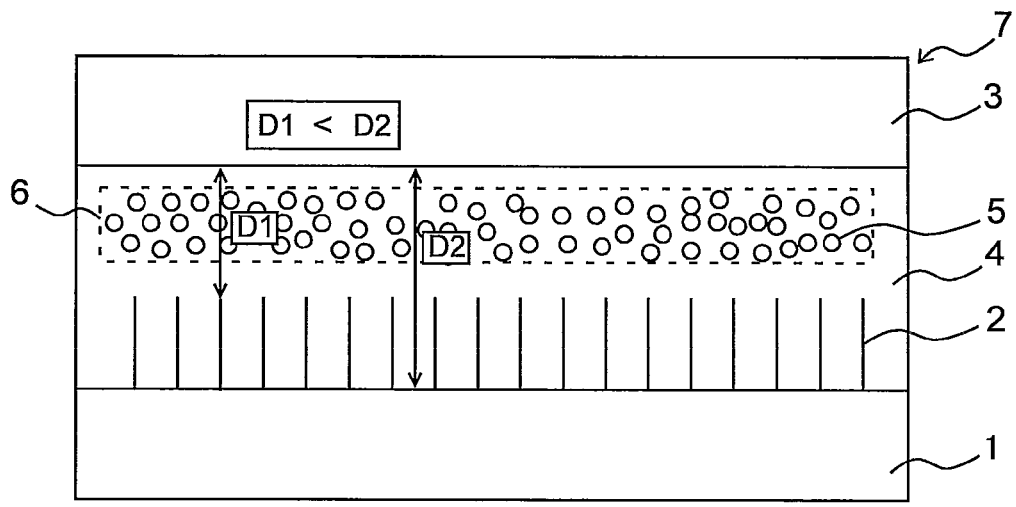
FIG. 1A is a schematic cross-sectional view of a light emitting device comprising the first electrode having carbon nanotubes or the like as the projections in accordance with an embodiment of the invention.
Figure 1B:
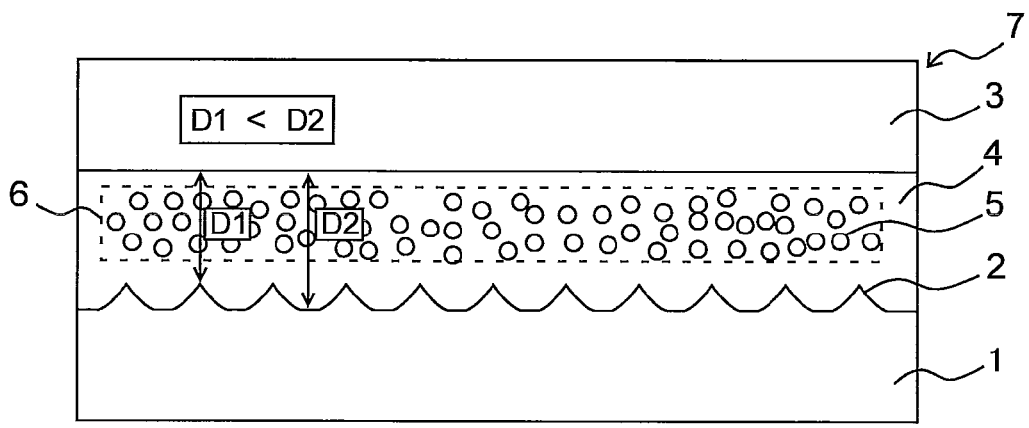
FIG. 1B is a schematic cross-sectional view of a light emitting device comprising the first electrode having conical silicons or the like as the projections in accordance with an embodiment of the invention.

With respect to a light emitting device 7 of the invention, as shown in FIGS. 1A and 1B, a distance D1 between upper ends of projections 2 and a second electrode 3 becomes shorter than a distance D2 between a first electrode 1 and the second electrode 3. When a voltage is applied between the first electrode 1 and the second electrode 3 of the light emitting device 7 of the invention, an electric field to be applied to a carrier 4 between the upper ends of the projections 2 and the second electrode 3 becomes larger than that to be applied to the carrier 4 between the parts of the first electrode 1 having no projections 2 and the second electrode 3. Further due to an effect of an electric field concentration upon tip ends of the projections, electrons of the upper ends of the projections 2 are more easily supplied to the carrier 4 than electrons of the upper ends of the parts of the first electrode 1 having no projections 2. Accordingly, electrons conduct selectively between the upper ends of the projections 2 and the second electrode 3.

The electrons supplied from the upper ends of the projections 2 and conducting in the carrier 4 are accelerated by the electric field applied between the first electrode 1 and the second electrode 3. The light emitting device 7 of the invention emits light by the accelerated electrons; however the mechanism is not made clear. For example, it is supposed as follows. The accelerated electrons cause mutual reaction with light emitters 5 in the carrier 4, so that electrons of the light emitters 5 can be excited and the light emitters 5 emit light. Alternatively, it is supposed that after an energy of the accelerated electrons is once converted into another energy such as electromagnetic wave or the like, the energy is supplied to the light emitters 5 to make the light emitters 5 emit light. It is therefore supposed that an energy is directly or indirectly supplied to excite electrons of the light emitters 5 in such a manner and thus the light emitters 5 can emit light.

Figure 1C:
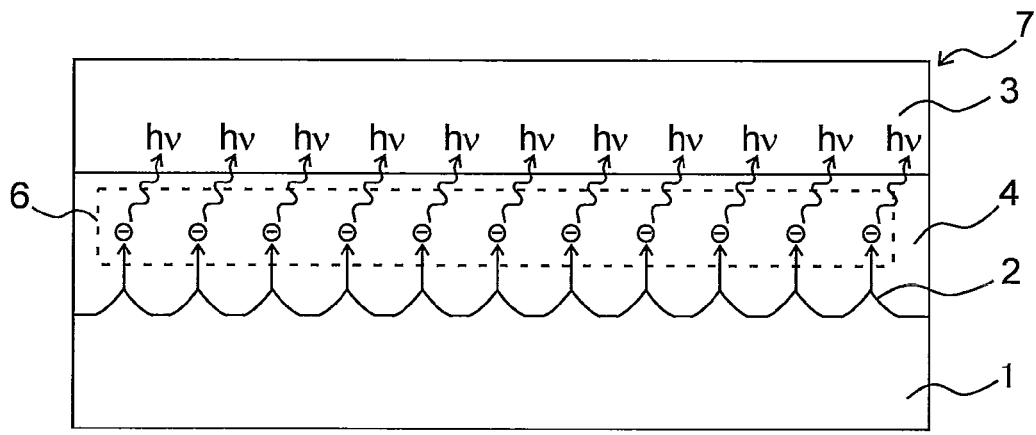
FIG. 1C is a schematic cross-sectional view of a light emitting device in accordance with an embodiment of the invention at the time of applying a voltage to the carrier between the first electrode and the second electrode.

Further, in the light emitting device 7 of the invention, since the projections 2 can be distributed evenly on a surface of the first electrode 1, emission is made possible in a light emitting region 6 between the projections 2 distributed evenly as shown in FIG. 1C and the second electrode 3. As a result, emission does not become uneven in the light emitting device 7 of the invention. In addition, although in this description, although it is described that electrons are supplied from the first electrode 1, the same effect can be caused also in the case where electrons are supplied from the second electrode 3.

Further, it is made easy to supply the electrons of the upper ends of the projections 2 by making the upper parts of the projections 2 have a sharpened shape. Accordingly, it is made easy to emit light by the light emitters 5 between the upper ends of the projections 2 and the second electrode 3. Further, the light emitting region 6 emitting light can be more evenly by making the upper parts of the projections 2 have the sharpened shape.

Moreover, in the light emitting device 7 of this embodiment, the light emitters 5 may be fine particles containing GeO and $GeO_2$. Thereby, electroluminescence emission is made possible particularly in a short wavelength region from ultraviolet to blue color (about 350 to 500 nm) by voltage application. Emission of a conventional light emitting device is mainly in a visible light region and also the emission is almost entirely red color in a relatively long wavelength region. Hereafter, it is supposed that requirements for optical communication using very thin wiring or wiring of various materials, such as fine waveguides in integrated semiconductor circuits, are increased. For this reason, if it is assumed that various wavelengths suitable for use modes are needed, light emitting devices emitting light not only in an existing wavelength but also in a shorter wavelength region become indispensable. Further, the light with a short wavelength can easily be converted to light with a long wavelength by using phosphors and thus various lights can be produced. Accordingly, it is expected that the light emitting device of the invention can be applied not only to optical communication fields but also to color displays or the like.

Hereinafter, one embodiment of the invention will be described with reference to drawings. The drawings and the configuration described as follows are illustrative and a scope of the invention is not limited to the drawings and following descriptions.

1-1. Structure of Light Emitting Device

A light emitting device 7 of this embodiment includes a first electrode 1, a light transmitting second electrode 3, and a light transmitting carrier 4 formed between the first electrode 1 and the second electrode 3 and containing light emitters 5 in the inside thereof, wherein the first electrode 1 has a plurality of projections 2 on a surface being in contact with the carrier 4 and a distance between upper ends of the projections 2 and the second electrode 3 is shorter than a distance between parts of the first electrode 1 other than the projections 2 and the second electrode 3.

When a voltage is applied between the first electrode 1 and the second electrode 3, light is emitted from the light emitters 5.

Hereinafter, each constituent element of the light emitting device 7 of this embodiment will be described.

1-1-1. First Electrode

The first electrode 1 is not particularly limited if it is made of a conductive substance and having a plurality of the projections 2 on the surface being in contact with the carrier 4. The first electrode 1 and the projections 2 may be made of the same material or different materials. For example, a part of the first electrode 1 other than the projections 2 is a conductive silicon substrate.

1-1-2. Projections

The projections 2 are not particularly limited if they are made of a conductive substance and are formed on a surface of the first electrode 1 being in contact with the insulating part. The projections 2 may be made of the same material as or a different material from the material of the first electrode 1.

The projections 2 may be carbon nanotubes or may be a conical metal or silicon.

A distance D1 between upper ends of the projections 2 and the second electrode 3 is shorter than a distance D2 of parts of the first electrode 1 having no projections 2 and the second electrode 3. Accordingly, when a voltage is applied between the first electrode 1 and the second electrode 3, an electric field applied to the carrier 4 between the upper ends of the projections 2 and the second electrode 3 is larger than an electric field applied between the parts of the first electrode 1 having no projections 2 and the second electrode 3. As a result, electron emission tends to be caused more easily between the upper ends of the projections 2 and the second electrode 3 and electron ejection is caused more easily in a light emission region between the upper ends of the projections 2 and the second electrode 3.

Further, a distance between a part of the first electrode 1 other than the projections 2 and the second electrode 3 may be adjusted to 1.1 times or more (e.g. 1.1, 1.2, 1.3, 1.4, 1.5, 1.6, 1.7, 1.8, 1.9 or 2 times or higher) as long as the distance between the upper ends of the projections 2 and the second electrode 3. Accordingly, emission is made easier in the light emitting region 6 between the upper ends of the projections 2 and the second electrode 3.

Moreover, the distance between the upper ends of the projections 2 and the second electrode 3 may be adjusted to 5 nm or longer and 100 nm or shorter (e.g. in a range between whichever numerals of 5, 10, 20, 30, 40, 50, 60, 70, 80, 90, and 100 nm). Accordingly, it is made easy to emit electrons between the upper ends of the projections 2 and the second electrode 3.

The projections 2 can be formed evenly on the surface of the first electrode 1 being in contact with the carrier 4 in the first electrode 1 side of the light emitting region 6 (a region where the light emitters 5 are formed). Accordingly, the light emitting region 6 where emission is caused easily between the upper ends of the projections 2 and the second electrode 3 can be formed evenly in the light emitting region 6. Accordingly, unevenness of emission of the light emitting device 7 of this embodiment can be eliminated. In this connection, "even(ly)" in this embodiment means that in the case where the surface of the first electrode 1 is divided uniformly so as to contain a constant number of the projections 2, a variation in the number of projections formed on the surface of the divided first electrode is little.

Further, the upper parts of the projections 2 may be formed to have a sharpened shape. Herein, the sharpened shape means a shape having an angle of 0 degree or higher and 150 degrees or longer. In this connection, if the projections 2 have the angle as an entire shape, the projections 2 may include those having round corner parts. Further, the sharpened shape may be a shape having one summit such as a cone or a pyramid and may also be a shape having a line as a summit such as a blade of a kitchen knife. The shape may be, for example, a rod-like shape and also a summit point of the sharpened shape may have a form facing toward the second electrode 3. Electron ejection is caused easily between the sharpened parts of the projections 2 and the second electrode 3 by making the upper parts of the projections 2 have the sharpened shape. Further, since the sharpened parts may be formed in a form of dots or lines, so that the light emitting region where emission is caused easily between the upper ends of the projections 2 and the second electrode 3 can be formed evenly in the light emitting region 6. Furthermore, with respect to a cross-sectional face cut along a plane including the summit, each of the projections may be formed to have a ridge line having a downward convex shape or to make a curvature radius of the summit smaller. In other words, each of the projections may have a conical shape with more moderate inclination as it goes far from the summit or a more sharpened shape in the most tip end part. In this case, the light emitting device is enabled to emit light by applying a low voltage between the first electrode 1 and the second electrode 3. Further, emission intensity can be increased by forming the projections in such a shape.

The neighboring two projections 2 are at an interval of 10 nm or wider and 3 μm or shorter (e.g. in a range between whichever two numerals of 10, 20, 30, 40, 50, 60, 70, 80, 90, 100, 150, 200, 300, 500, 1000, 2000, and 3000 nm). Accordingly, the light emitting region 6 where emission is caused easily between the upper ends of the projections 2 and the second electrode 3 can be formed evenly in the light emitting region 6.

1-1-3. Second Electrode

The second electrode 3 is not particularly limited in the configuration if it is made of a light transmitting conductive material and suitable for applying a voltage between the first electrode 1 and suitable for applying an electric field to the carrier 4. For example, the second electrode 3 may be an ITO electrode. In this connection, in the invention, the light transmitting property means capability of transmitting light of a light emitting wavelength of a light emitting device.

1-1-4. Carrier

The carrier 4 is not particularly limited if it is formed between the first electrode 1 and the second electrode 3 and contains the light emitters 5 in the inside thereof and is capable of extracting light and emitting light by a voltage application. It is typically a light transmitting insulator. Further, it may be a semiconductor with a low impurity concentration. In this case, a distance between the light emitters 5, which are light emitting sources, and the second electrode 3 is preferably short. For example, in the case of a wide gap semiconductor of SiC or GaN, if a thickness thereof is about 100 nm or thinner, about 40 to 80% of the light with a wavelength of about 300 to 500 nm can be transmitted. That is, the carrier is not in a bulk state and in a situation of using it actually in the invention, the carrier may be proper if it contains the light emitters 5 in the inside thereof and has a light transmitting property and emits light by electron supply between the first electrode and the second electrode by voltage application. The light transmittance of the carrier is not particularly limited; however it is preferable that the transmittance of light with a wavelength range of 300 to 500 nm is 80% or higher. In the case where the light emitters 5 are fine particles containing GeO and GeO$_2$, a peak wavelength of a light emitted from the carrier 4 containing the light emitters 5 is around 400 nm, and therefore if the transmittance of light with a wavelength of 300 to 500 nm is higher, light extraction efficiency can be heightened correspondingly and therefore it is preferable. Further, a material of the carrier 4 is not particularly limited; however it is preferable to be made of an insulator. It is because, in this case, electric current conducting between the electrodes without contributing to emission can be lowered and effective light emitting efficiency can be improved and emission is made possible at a low power consumption. The carrier 4 is, for example, made of silicon oxide, silicon nitride, or silicon oxynitride. In this case, since the carrier is a silicon type insulating film and silicon is easier to be bonded with oxygen than germanium, germanium atoms are not unnecessarily bonded with oxygen and also silicon oxide, silicon nitride, or silicon oxynitride is relatively hard to transmit oxygen and therefore germanium atoms are not oxidized due to outside air penetration and accordingly, emission is stabilized and is scarcely deteriorated. Further, silicon oxide, silicon nitride, or silicon oxynitride is formed into a film in common silicon semiconductor process and is thus excellent in mass productivity and suitable for combination with other electronic circuits.

A thickness of the carrier 4 is, for example, 5 nm or thicker and 100 nm or thinner (e.g. in a range between whichever two numerals of 5, 10, 20, 30, 40, 50, 60, 70, 80, 90 and 100 nm) at the upper end parts of the projections 2 and, for example, 12 nm or thicker and 1000 nm or thinner at parts other than the projections 2.

Further, the light transmittance of the carrier 4 is preferably 80% or higher of the transmittance of light with a wavelength range of, for example, 300 to 500 nm. In the case where the light emitters 5 are fine particles containing GeO and GeO$_2$, a peak wavelength of light emitted from the light emitters 5 is around 390 nm and if the transmittance of light with a wavelength range of 300 to 500 nm is higher, light extraction efficiency can be heightened more correspondingly, and therefore it is preferable.

Further, in the case where the carrier 4 is made of silicon oxide, silicon nitride, or silicon oxynitride and projections 2 are made of mainly silicon or carbon, the properties are stabilized. It is supposed that along with ejection of electrons from tips of the projections 2, atoms constituting the projections 2, that is, silicon and carbon is suppressed from dissociation in the case of silicon or carbon and therefore, an electron ejecting property can be stabilized. It is because if deterioration is caused, height and shape of the projections 2 are changed and intensity of the electric field is changed.

1-1-5. Light Emitters

The light emitters 5 are not particularly limited if they are formed in the carrier 4 and to be light emitting sources. Further, a plurality of the light emitters 5 may be formed in the carrier 4.

Further, the light emitters 5 are, for example, fine particles, metal atoms, and metal ions, or, for example, fine particles of germanium, silicon or Sn. The light emitters 5 may also be, for example, fine particles containing GeO and GeO$_2$. In this case, the light emitters 5 may contain germanium (metal).

The number density of the light emitters 5 in the light emitting region 6 is not particularly limited; however it is $1\times10^{16}$ particles/cm$^3$ to $1\times10^{21}$ particles/cm$^3$.

In the inorganic EL devices, the light emitters 5 are the phosphor particles in the dispersion type EL devices and the emission centers in the thin film type EL devices. It is known that the phosphor particles are e.g. ZnS particles and the emission centers are e.g. Mn in ZnS. Among the conventional inorganic EL devices, there are also materials which emit blue light in about 460 to 480 nm; however they require a high voltage of about 100 V or higher, and moreover they are not enough to give sufficient luminance.

The fine particles, which are the light emitters 5, are preferable to have the maximum particle diameter of 1 to 20 nm. It is because emission efficiency is particularly heightened in this case. In the invention, "maximum particle diameter" means the largest particle diameter among particle diameters of those observed in the case where a range of a 100 nm square of an arbitrary cross section of the carrier 7 is observed by TEM observation (it may be a cross-sectional view shown in FIG. 1 or a cross-sectional view vertical to paper). Further, in the invention, "particle diameter" means a length of the longest line where a plane image of a fine particle projected to a TEM photograph can include. The maximum particle diameter of the fine particles, which are the light emitters 5, may be, for example, 1, 2, 3, 4, 5, 6, 7, 8, 9, 10, 12, 14, 16, 18 or 20 nm. The maximum particle diameter of the fine particles, which are the light emitters 5, may be in a range between whichever two numerals exemplified above and may be whichever one numeral value or lower.

Figure 2:
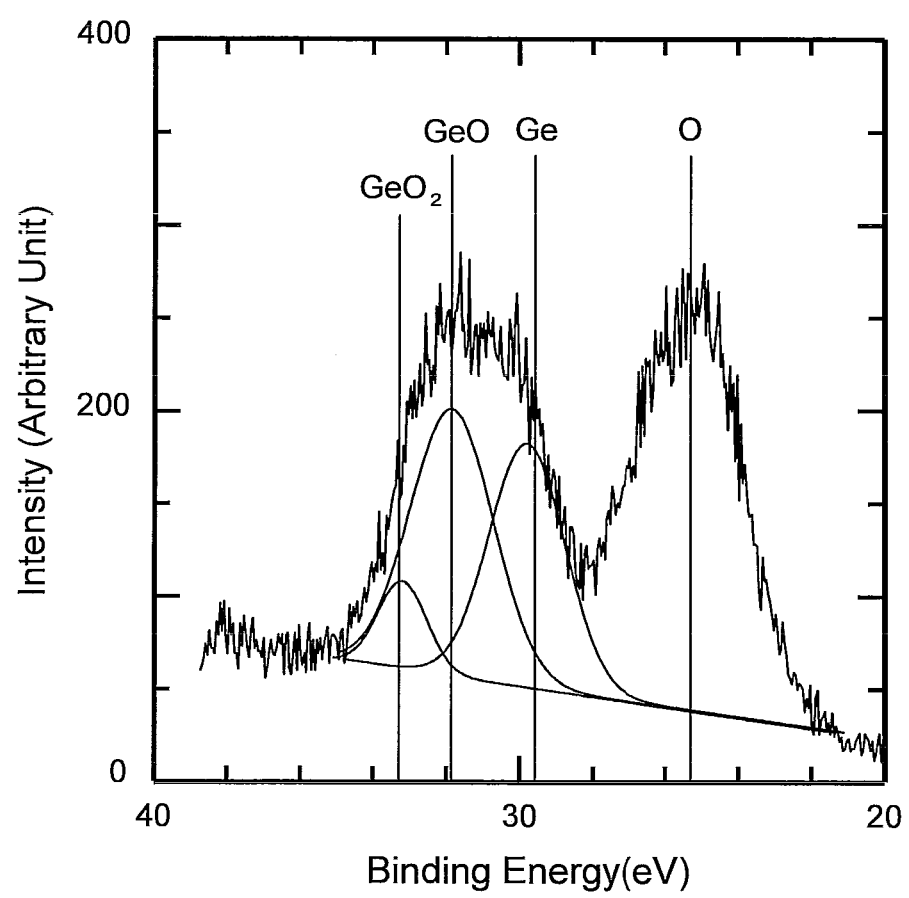
FIG. 2 shows one example of XPS spectra for explaining Gauss fitting used to measure a ratio of GeO and $GeO_2$ contained in the light emitters in a light emitting device in accordance with an embodiment of the invention.

In the case where the light emitter 5 are the fine particles containing GeO and $GeO_2$, a ratio of GeO to an entire germanium oxide ($GeO_2$+GeO) can be determined by measuring peak surface area $S_{GeO2}$ attributed to $GeO_2$ and peak surface area $S_{GeO2}$ attributed to GeO in a spectrum near 3d peak of an XPS spectrum and calculating $S_{GeO}/(S_{GeO2}+S_{GeO})$. As an X-ray source for XPS measurement, for example, Al Kα-ray (1486.6 eV) made monochromatic can be employed. The peak attributed to $GeO_2$ and the peak attributed to GeO are overlapped in skirt parts; however Gauss fitting may be carried out as shown in FIG. 2 to separate a waveform of the peak attributed to $GeO_2$ and the peak attributed to GeO and thus the surface areas $S_{GeO2}$ and $S_{GeO}$ can be measured. Peak energies of $GeO_2$ and GeO are about 33.5 and 32 eV, respectively.

In the case where the light emitters 5 are fine particles containing GeO and $GeO_2$, when the sum of $GeO_2$ and GeO contained in the light emitters 5 is 100%, GeO can be preferably contained 10% or higher. It is because if the ratio of GeO is too low, emission may sometimes be impossible or emission intensity may become too low. The ratio of GeO may be, for example, 10, 20, 30, 40, 50, 60, 70, 80, 90, 95, 99 or 100%. The ratio of GeO may be in a range of whichever two numeral values exemplified herein.

Incidentally, in a spectrum near 2p peak of Ge in the XPS spectrum, oxidation ratio of Ge can be determined by measuring peak surface area $S_{Ge}$ attributed to germanium (Ge) and peak surface area $S_{oxidizedGe}$ attributed to germanium oxide ($GeO_2$+GeO) and calculating $S_{GeO}/(S_{Ge}+S_{oxidizedGe})$. Further, an average value of an oxidation rate can be calculated in the same manner as in the calculation of the average value of the oxygen deficiency rate. The average value of the oxidation rate is not particularly limited; however it may be, for example, 1, 5, 10, 15, 20, 25, 30, 34.9, 35, 40, 45, 50, 55, 60, 60.1, 65, 70, 70.1, 75, 80, 85, 90, 95, 99, 100%. The average value of the oxidation rate may be in a range between whichever two numeral values exemplified herein.

1-1-6. Light Emitting Region

The light emitting region 6 is a region in the inside of the carrier 4 where the light emitters 5 are formed and a region capable of emitting light when a voltage is applied between the first electrode 1 and the second electrode 3. The light emitting region 6 may be formed in the entire carrier 4 or in a part of the carrier 4.

1-2. Method for Using Light Emitting Device

The light emitting device 7 of this embodiment can emit light by voltage application between the first electrode 1 and the second electrode 3. The voltage to be applied may be a DC voltage or an AC voltage. A waveform of the AC voltage is, for example, sinusoidal and a voltage thereof is, for example, 5 to 100 Vp-p and a frequency thereof is, for example, 0.1 Hz to 10 kHz. The voltage is specifically, for example, 5, 10, 20, 30, 40, 50, 60, 70, 80, 90, and 100 Vp-p. The voltage may be in a range between whichever two numeral values exemplified herein. The frequency is specifically, for example, 0.1, 0.2, 0.5, 1, 2, 5, and 10 kHz. The frequency may be in a range between whichever two numeral values exemplified herein.

1-3. Method for Manufacturing the Light Emitting Device 1-3-1. Formation of First Electrode The first electrode 1 having the projections 2 can be formed by, for example, using a conductive silicon substrate. Herein, a formation method using etching, a formation method using leaser annealing, and a method for forming carbon nanotubes will be described as examples.

1-3-2. Formation Method Using Etching

Dot-like etching masks are formed on the surface of the first electrode 1 and the surface of the first electrode 1 is etched. In the etching, the first electrode 1 on which the masks are not formed is removed and outside of the first electrode 1 under the dot-like etching masks is gradually removed. When the etching is continued, the first electrode 1 having the summits with a conical shape immediately under the center parts of the dot-like etching masks can be left without being etched. After that, the masks are removed to form the first electrode 1 having the conical projections 2.

1-3-3. Formation Method Using Laser Annealing

For example, a silicon substrate is irradiated with coherent linear polarized laser beam while being moved transversely and this irradiation is successively carried out in the vertical direction of the silicon substrate to carry out annealing treatment. In this annealing treatment, a temperature distribution is generated in the silicon substrate corresponding to cyclic light intensity distribution. Therefore, a stripe-like form having cyclic modulation can be formed on a surface of the silicon substrate. Further the silicon substrate is turned at 90° around a vertical axis of an irradiation face and is again irradiated with laser beam to carry out similar annealing treatment. Accordingly, the first electrode 1 having island-like projections 2 at crossing points of the stripes crossing at 90° can be formed. For example, in the case where laser with wavelength of 532 nm is carried out, the first electrode 1 having the projections at intervals about 500 to 550 nm and having a height of 30 to 50 nm can be formed.

1-3-4. Formation Using Carbon Nanotubes

In carbon nanotube growth on the surface of the first electrode 1 by a coating method, a material having a catalytic function (e.g. ferric metals such as iron, nickel, cobalt, or the like; platinum, rhodium, or the like) is formed and thereafter, a hydrocarbon type gas such as methane, ethane, propane, ethylene, propylene, or the like is flown and carbon nanotubes are formed on the surface of the first electrode 1 by a thermal CVD method or a plasma CVD method.

1-3-5. Formation of Carrier

The carrier 4 can be formed on the first electrode 1. For example, silicon oxide or silicon nitride is deposited by CVD or sputtering to form the carrier 4 on the first electrode 1. Since the projections 2 are formed on the surface of the first electrode 1, the projections reflecting the projections may be formed on the upper face of the carrier 4 in some cases; however, in this case, the upper face of the carrier 4 can be flattened by CMP or the like.

1-3-6. Formation of Light Emitters

The light emitters 5 are formed in the inside of the carrier 4. A method for forming the light emitters 5 in the carrier 4 is not particularly limited; however, as one example, it is supposed a method of ion implantation of metal ions into the carrier 4. In the case where the light emitters 5 are fine particles containing GeO and $GeO_2$, a method supposed to be possible may involve ion implanting germanium into the carrier 4 and thereafter carrying out a heat treatment. The ions are agglomerated by the heat treatment after the ion implantation and a large number of fine particles are formed in the carrier 4, Ge is oxidized to form GeO and $GeO_2$. The ion implantation of germanium can be carried out in conditions of, for example, an implantation energy of 5 to 100 keV and an implantation amount of $1\times10^{14}$ to $1\times10^{17}$ ions/cm$^2$.

A ratio of GeO and $GeO_2$ is can properly be controlled by changing a germanium implantation amount, a heat treatment time, a heat treatment temperature, a heat treatment atmosphere and the like. Specifically, the ratio of GeO can be increased by controlling a partial pressure and flow rate of oxygen in the heat treatment atmosphere. For example, in the case where an atomic concentration of germanium in silicon oxide with a film thickness of 50 nm is 10% or lower, in a heat treatment at 800° C. for 1 hour, if an inert gas is supplied (50 ml/min) while vacuum evacuation is carried out (400 ml/min), although partially bonded with oxygen, germanium is not completely oxidized since oxygen is insufficient and GeO may be generated. In the atmosphere of 1 atm containing an inert gas mixed with 20% by volume of oxygen, oxygen supply is so much as to increase $GeO_2$ and decrease GeO. Although depending on other parameters such as germanium implantation conditions and a heat treatment time and temperature, an atmosphere proper for increasing the ratio of GeO can increase the ratio of GeO, for example, by relatively increasing the atomic concentration of germanium and supplying an inert gas mixed with oxygen while vacuum evacuation is carried out.

Further, the ion implantation is preferably carried out to adjust a germanium concentration in the carrier 4 to be 0.1 to 20% by atom. It is because in the case where an inert gas (50 ml/min) is supplied while vacuum evacuation (400 l/min) is carried out in the heat treatment at 800° C. for 1 hour, emission is made possible in the range. The germanium concentration is specifically 0.1, 0.2, 0.5, 1.0, 1.4, 2, 3, 5, 6, 10, 11, 15, and 20% by atom. Further preferably, it is 2 to 11% by atom. The concentration may be in a range between whichever two numeral values exemplified above. In an EL experiment, emission can be confirmed with eyes even at 2% by atom or higher and emission intensity is lowered if it exceeds 11% by atom and therefore, if it is in this range, it is supposed that light emitting efficiency can be improved. The germanium concentration can be measured by a high reaction solution RBS (Rutherford Back Scattering) method. Besides, measurement is made possible by various analysis methods such as SIMS (Secondary Ion Mass Spectroscopy). The measurement of the germanium concentration is carried out in a range of $1/100$ of a peak value of the germanium concentration. The temperature of the heat treatment is preferably 400 to 1000° C. and more preferably 700 to 900° C. It is because if it is in this range, the light emitting efficiency is supposed to be relatively high as the EL experiment result.

1-3-7. Formation of Second Electrode

The light transmitting second electrode 3 is formed on the carrier 4 in which the light emitters 5 are formed. For example, an ITO electrode may be formed by sputtering.

2. Second Embodiment

With respect to the conventional light emitting device containing fine particles in an insulating film, it is necessary to apply an intense electric field of about several MV/cm to the insulating film and light emitting efficiency is low. There are also a problem that if the electric field is converged upon one point of an insulating film, an entire body of the light emitting device is broken, and, further, a problem that emission is uneven.

In view of these problems, the second embodiment is made to provide an improved light emitting device with good light emitting efficiency and even light emission.

A light emitting device of this embodiment is characterized by comprising a first electrode having a p-type semiconductor part and an n-type semiconductor part forming a pn-junction, which is a first electrode at least in an upper face; a light transmitting carrier formed on the first electrode and containing light emitters in the inside thereof; a light transmitting electrode, which is a second electrode, formed on the carrier; a third electrode formed on a surface of the p-type semiconductor part and on a part of a surface where the carrier is not formed; and a fourth electrode formed on a surface of the n-type semiconductor part and on a part of a surface where the carrier is not formed, wherein the carrier and the light transmitting electrode are formed in this order on the pn-junction part comprising the p-type semiconductor part and the n-type semiconductor part on the upper face of the first electrode.

In the light emitting device of this embodiment, it is found that when a negative voltage is applied to the third electrode connected to the p-type semiconductor part; a positive electrode is applied to the light transmitting electrode; and the fourth electrode connected to the n-type semiconductor part is at a potential between the third electrode and the light transmitting electrode, for example, earthed; the light emitting device is enabled to emit light efficiently at a lower voltage than a conventional light emitting device utilizing FN tunneling. It will be described with reference to FIGS. 3 and 4.

Figure 3:
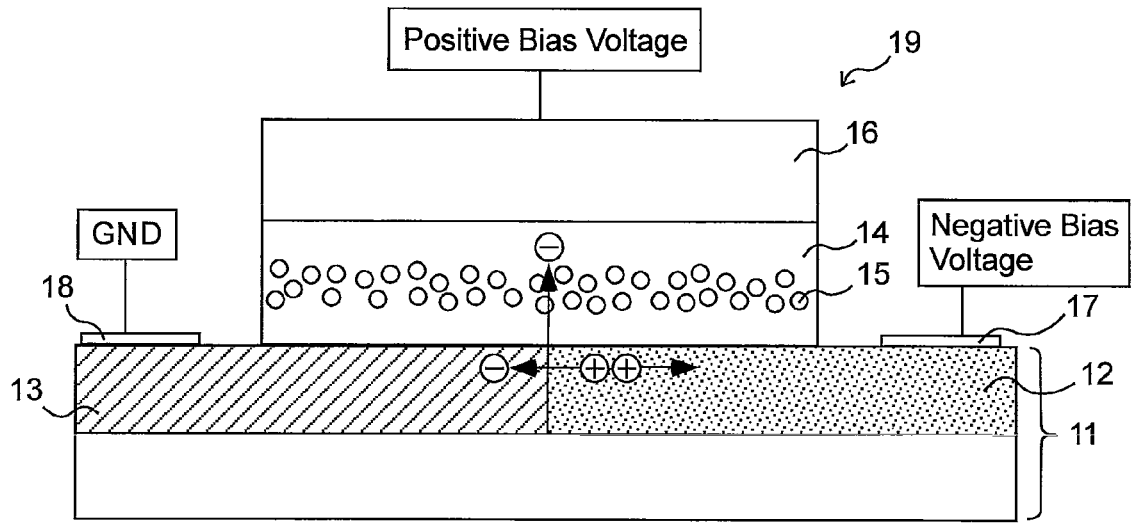
FIG. 3 is a schematic cross-sectional view of a light emitting device comprising the first electrode having a pn junction in accordance with an embodiment of the invention.
Figure 4:
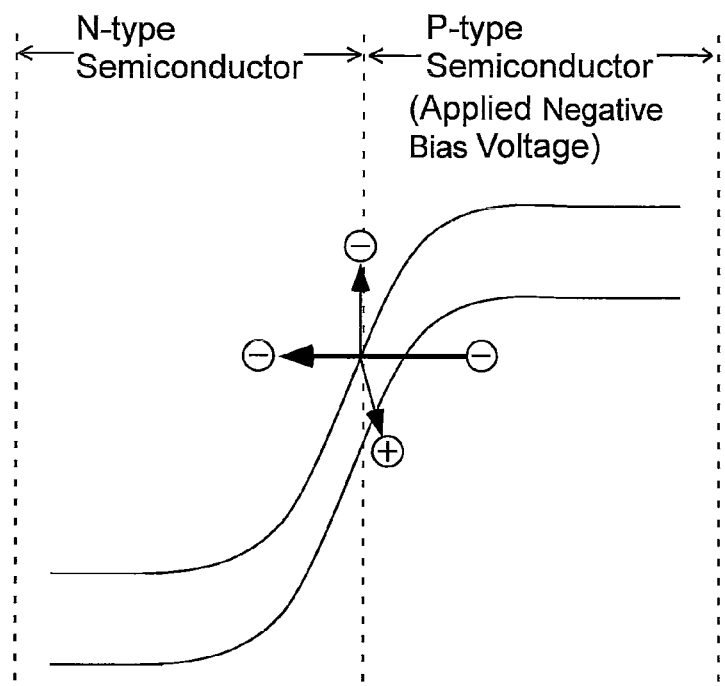
FIG. 4 is an energy band diagram of the first electrode in the vicinity of the pn junction of a light emitting device in accordance with an embodiment of the invention.

As shown in FIG. 3, when a negative voltage is applied to a third electrode 17 of a light emitting device 19 and GND voltage is applied to a fourth electrode 18, reverse bias is generated and if a potential difference is low, no electric current conducts between a p-type semiconductor part 12 and an n-type semiconductor part 13. When a certainly high negative voltage is applied to the third electrode 17, an energy band as shown in FIG. 4 is generated and an electric field applied to a junction part becomes intense and therefore, tunnel electric current is generated owing to a conduction of electrons of a valence band of the p-type semiconductor to a conduction band of the n-type semiconductor. The electrons of the valence band of the p-type semiconductor conducting to the conduction band of the n-type semiconductor are accelerated by an electric field between the third electrode 17 and the fourth electrode 18 or an electric field between the third electrode 17 and a light transmitting electrode 16 applied a positive voltage and come into collision against lattice atoms to generate pairs of hot electrons and hot holes. Some of the hot electrons are accelerated by an electric field between the third electrode 17 and the light transmitting electrode 16 or between the fourth electrode 18 and the light transmitting electrode 16 and supplied to the carrier 14. It is supposed that the hot electrons cause mutual reaction with the germanium light emitters 15 in the inside of the carrier 14 and excite an energy level of the light emitters 15 to enable the light emitters 15 to emit light.

Hereinafter, the explanation relevant to a light emission principle will be given while exemplifying the hot electrons and in the case where a negative voltage is applied to the light transmitting electrode 16, the hot holes cause mutual reaction with the light emitters 15 in the inside of the carrier 14 and excite the energy level of the light emitters 15 and therefore, it is supposed to be possible to emit light same as described above.

In order to enable the light emitting device 19 to emit light, it is required that an electric field sufficient to generate tunnel electric current is applied between the third electrode 17 and the fourth electrode 18 and also an electric field sufficient to supply the generated hot electrons to the carrier 14 is applied between the third electrode 17 and the light transmitting electrode 16 or between the fourth electrode 18 and the light transmitting electrode 16. The electric field to be applied between the third electrode 17 and the light transmitting electrode 16 or between the fourth electrode 18 and the light transmitting electrode 16 is lower than an electric field sufficient to supply electrons to the conduction band of the carrier 14 by FN tunneling. Accordingly, in the light emitting device 19, electron implantation efficiency to the carrier 14 becomes high as compared with that of FN tunneling. A ratio of the electron implantation efficiency of the light emitting device 19 of the invention and the electron implantation efficiency of a conventional light emitting device utilizing FN tunneling is calculated to be about 7:1 from experiment results. Accordingly, the light emitting device of the second embodiment is enabled to efficiently emit light at a low voltage as compared with the conventional light emitting device utilizing FN tunneling. Further, in the case where the same voltage is applied to the light emitting device of the second embodiment and to a conventional light emitting device, luminance of the light emitting device of the second embodiment becomes higher. Further, in the case of the light emitting device of the second embodiment, a problem that the electric field is converged upon one point of the carrier and the entire device is broken is not caused.

Further, in the case of an electron implantation method using FN tunneling as shown in the conventional example, since a generation site and an acceleration site of the hot electrons are carriers, when a needed voltage is applied, the carrier is considerably damaged, whereas according to the electron implantation method of the second embodiment, the hot electron generation site is the pn junction part and also the acceleration site is the carrier and thus both are separated and there is an advantage that the damage on the carrier 14 by high electric field application is slight.

Further, in the case of the conventional light emitting device utilizing FN tunneling, emission is intensely generated at a point where the electric field between electrodes becomes maximum and emission is scarcely generated at a point where the electric field between electrodes is slight and thus uneven emission is generated. Accordingly, unevenness of a film thickness of the carrier 14 directly affects unevenness of the emission.

On the other hand, with respect to the light emitting device 19 of the second embodiment, it is supposed that hot electrons generated in a vicinity of the pn-junction in the first electrode 11 come into collision against the light emitters 15 to enable the light emitters 15 to emit light. An energy of the hot electrons generated by this method is determined in accordance with the electric field applied between the third electrode 17 and the light transmitting electrode 16 or between the fourth electrode 18 and the light transmitting electrode 16 and thus the energy which the hot electrons obtain is determined regardless of the film thickness unevenness of the carrier 14. Accordingly, since the effect of the film thickness of the carrier 14 is slight, unevenness of the emission can be suppressed low.

Further, since the light emitters 15 which emit light in the carrier 14 can be set evenly by forming the pn-junction at a constant interval on the upper face of the first electrode 11 adjacent to the carrier 14 or forming evenly the pn-junction and therefore, unevenness of the emission can be eliminated.

The light emitters 15 may be fine particles containing GeO and $GeO_2$. Thereby, the light emitting device 19 emits light with a peak wavelength of light emission is in a range of 340 to 440 nm. Emission of light emitting devices in which fine particles are formed in the conventional insulating film is in a visible light region [for example, see Japanese Unexamined Patent Publication No. Hei 11(1999)-310776] and almost all of them emit light such as red light in a relatively long wavelength range. In view of application of displays or the like, a light emitting device having a shorter wavelength region has highly been desired. In this respect, the light emitting device of the second embodiment is expected to the application of displays or the like.

Hereinafter, the second embodiment of the invention will be described with reference to drawings. The drawings and the configuration described as follows are illustrative and a scope of the invention is not limited to the drawings and following descriptions.

2-1. Structure of Light Emitting Device

A light emitting device 19 of this embodiment is characterized by comprising a first electrode 11 having a p-type semiconductor part 12 and an n-type semiconductor part 13 forming a pn-junction at least in an upper face; a light transmitting carrier 14 formed on the first electrode 11 and containing light emitters 15 in the inside thereof; a light transmitting electrode 16 formed on the carrier 14; a third electrode 17 formed on a surface of the p-type semiconductor part and on a part of a surface where the carrier is not formed; and a fourth electrode 18 formed on a surface of the n-type semiconductor part and on a part of a surface where the carrier is not formed, wherein the carrier 14 and the light transmitting electrode 16 are formed in this order on the pn-junction part comprising the p-type semiconductor part 12 and the n-type semiconductor part 13 on the upper face of the first electrode 11.

Hereinafter, each constituent element of the light emitting device 19 of this embodiment will be described.

2-1-1. First Electrode

The first electrode 11 is not particularly limited if it comprises the p-type semiconductor part 12 and the n-type semiconductor part 13 forming the pn-junction at least in an upper face. For example, it may be a p-type silicon substrate on which an n-type region is formed on an upper part or it may be an n-type silicon substrate on which a p-type region is formed on an upper part. Further, it may be a $SiO_2$ substrate on which a p-type silicon and an n-type silicon are formed and also it may be a Si substrate on which a carrier such as $SiO_2$ is formed and further a p-type silicon and an n-type silicon are formed thereon. In this case, the device of the second embodiment may be formed on a SIO (Silicon On Insulator) substrate using a crystalline silicon substrate or amorphous silicon may be formed on an insulator layer such as $SiO_2$ by a CVD method or the like and then the device of the second embodiment may be formed thereon.

Figure 5A:
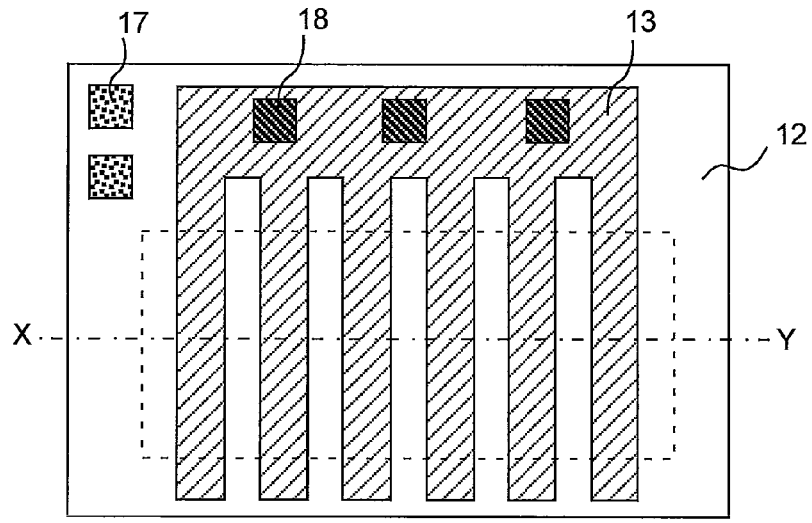
FIG. 5A is a schematic plane view of the first electrode in which a comb-like n-type semiconductor part is formed in accordance with an embodiment of the invention.

FIG. 5A is one example of a first electrode of the light emitting device of the second embodiment of the invention and a plane view of a first electrode obtained by forming an n-type silicon in comb-like form on an upper face of a p-type silicon substrate, forming the third electrode 17 on an upper face of the p-type silicon, and forming the fourth electrode 18 on an upper face of the n-type silicon.

Figure 5B:
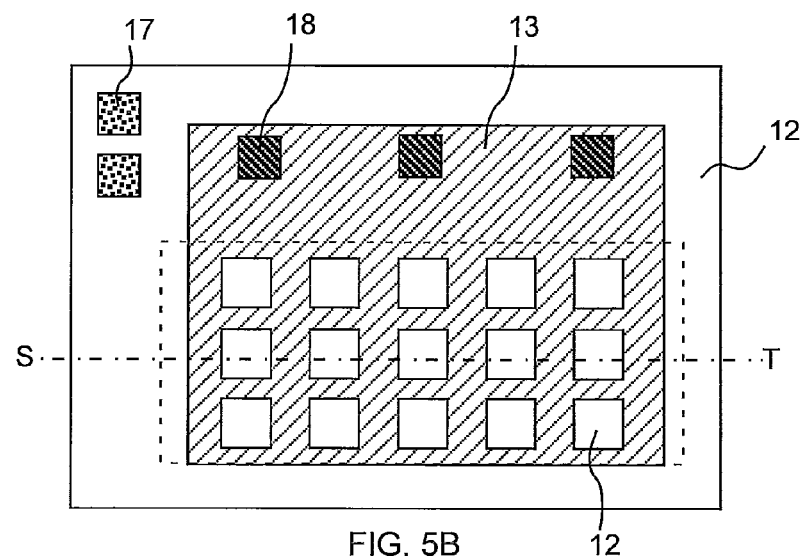
FIG. 5B is a schematic plane view of the first electrode in which a curb-like n-type semiconductor part is formed in accordance with an embodiment of the invention.
Figure 5C:
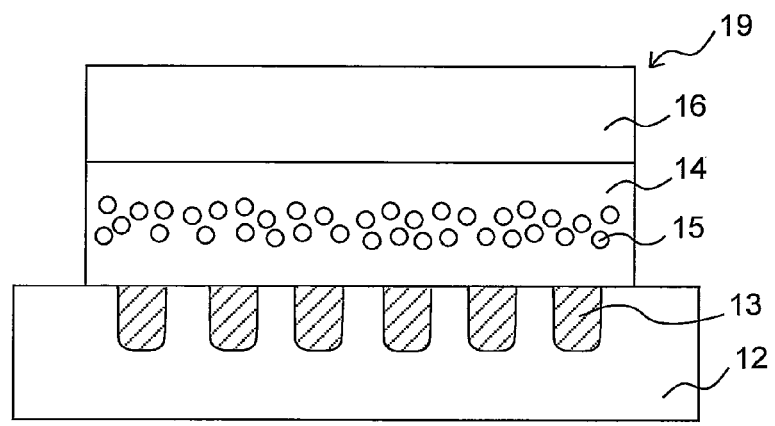
FIG. 5C is a schematic cross-sectional view of a light emitting device taken along the chain line X-Y of FIG. 5A or taken along the chain line S-T of FIG. 5B.

In addition, the carrier 14 and the light transmitting electrode 16 may be formed in a part surrounded with a dotted line in FIG. 5A. FIG. 5B is one example of a first electrode of the light emitting device of the second embodiment of the invention and a plane view of a first electrode obtained by forming an n-type silicon in a curb-like form on an upper face of a p-type silicon substrate, forming the third electrode 17 on an upper face of the p-type silicon, and forming the fourth electrode 18 on an upper face of the n-type silicon. In addition, the carrier 14 and the light transmitting electrode 16 may be formed in a part surrounded with a dotted line in FIG. 5B. FIG. 5C is a schematic cross-sectional view of the light emitting device take along the chain line X-Y of FIG. 5A or take along the chain line S-T of FIG. 5B. The first electrode 11 may be specifically formed as shown in FIGS. 5A to 5B.

2-1-2. P-Type Semiconductor Part

The p-type semiconductor part 12 is not particularly limited if it is a part of a p-type semiconductor contained in the first electrode 11 and forms a pn-junction with the n-type semiconductor part 13 and it may be, for example, p-type silicon and an impurity concentration is, for example, $1\times10^{19}$ to $1\times10^{20}$/cm³ (e.g. in a range between whichever two numerals of $1\times10^{16}$, $1\times10^{17}$, and $1\times10^{18}$).

2-1-3. N-Type Semiconductor Part

The n-type semiconductor part 13 is not particularly limited if it is a part of a n-type semiconductor contained in the first electrode 11 and forms a pn-junction with the p-type semiconductor part 12 and it may be, for example, n-type silicon and an impurity concentration is, for example, $1\times10^{16}$ to $1\times10^{18}$/cm³.

The impurity concentrations of the p-type semiconductor part 12 and the n-type semiconductor part 13 are rough standards in the case where a positive voltage is applied to the light transmitting electrode 16 and GND voltage is applied to the n-type semiconductor part 13. As described above, the second embodiment is supposed to exert the same emission effect even by applying GND voltage to the p-type semiconductor part 12 and applying a positive voltage to the n-type semiconductor part 13 and in this case, the impurity concentrations of the p-type semiconductor part 12 and the n-type semiconductor part 13 may be exchanged mutually with the rough standards.

2-1-4. PN Junction

The pn-junction is an interface where the p-type semiconductor part 12 and the n-type semiconductor part 13 are in contact with each other. Further, parts forming the pn-junction may be formed at constant intervals on the upper face of the first electrode 11 adjacent to the carrier 14. Furthermore, the parts forming the pn-junction may be formed evenly on the upper face of the first electrode 11 adjacent to the carrier 14. Specifically, the pn-junction may be formed as shown in FIG. 5A or 5B.

Accordingly, the carrier 14 is enabled to emit light without unevenness by applying a voltage to the light emitting device 19 of this embodiment. It is because of following: that is, in the light emitting device 19 of this embodiment, electrons are supplied to the carrier 14 from the first electrode in a vicinity of the pn-junction to carry out emission and thus the light emitters 15 between a part having the pn-junction and the light transmitting electrode 16 emit light.

2-1-5. Third Electrode

The third electrode 17 is not particularly limited if it is formed on a surface of the p-type semiconductor part 12 and on a part of a surface where the carrier 14 is not formed and is proper for having an ohmic contact with the p-type semiconductor part 12. The third electrode 17 is, for example, Au, Pt, Ag, Co, Ni, Ti, Ta, W, etc.

2-1-6. Fourth Electrode

The fourth electrode 18 is not particularly limited if it is formed on the surface on the n-type semiconductor part 13 and on a part of a surface where the carrier 14 is not formed and is proper for having an ohmic contact with the n-type semiconductor part 13. The fourth electrode 18 is, for example, Au, Pt, Ag, Co, Ni, Ti, Ta, W, etc.

2-1-7. Second Electrode

The light transmitting electrode 16, which is the second electrode, is not particularly limited if it is an electrode having a transmittance of light with a wavelength of 300 nm or longer and 500 nm or shorter of 60% or higher and 99.99% or lower. The light transmitting electrode 16 is, for example, a metal oxide thin film such as ITO, or a metal thin film of Al, Ti, or Ta, or a semiconductor thin film of Si, SiC, GaN, or the like.

2-1-8. Carrier

The carrier 14 is not particularly limited if it is formed on the first electrode 11 and contains the light emitters 15 in the inside thereof and has a light transmitting property. For example, the carrier 14 is made of silicon oxide, silicon nitride, or silicon oxynitride. In this case, the carrier is a silicon type insulating film and silicon is easier to be bonded with oxygen than germanium and therefore, a germanium atom is not unnecessarily bonded with an oxygen atom, and also silicon oxide, silicon nitride, or silicon oxynitride is relatively hard to transmit oxygen and therefore, a germanium atom is not oxidized by outside air permeation and consequently, emission can be stabilized and is scarcely deteriorated. Further, silicon oxide, silicon nitride, or silicon oxynitride can be formed into a film in common silicon semiconductor process and is therefore excellent in mass productivity and moreover made possible to be combined with another electronic circuit.

A thickness of the carrier 14 is, for example, 10 nm or thicker and 100 nm or thinner (e.g. in a range between whichever two numerals of 10, 20, 30, 40, 50, 60, 70, 80, 90 and 100 nm).

In this connection, the light transmitting property in the second embodiment means that capability of transmitting light emitted by the light emitting device 19 of the second embodiment. The light transmittance of the carrier 14 is preferably 80% or higher transmittance of light with a wavelength range of 300 nm or longer and 500 nm or shorter. It is because in the case where the light emitters 15 are fine particles containing GeO and $GeO_2$, since a peak wavelength of light emitted from the light emitters 15 is around 390 nm, light extraction efficiency can be higher correspondingly as the transmittance of light with a wavelength of 300 to 500 nm is higher.

2-1-9. Light Emitters

The light emitters 15 are not particularly limited if they are formed in the carrier 14 and to be light emitting sources. Further, a plurality of the light emitters 15 may be formed in the carrier 14.

Further, the light emitters 15 are, for example, fine particles, metal atoms and metal ions, or, for example, fine particles of germanium, silicon or Sn. The light emitters 15 may also be, for example, fine particles containing GeO and $GeO_2$. In this case, the light emitters 15 may contain germanium (metal). The number density of the light emitters 15 in the light emitting region 16 is not particularly limited; however it is $1\times10^{16}$ particles/cm³ to $1\times10^{21}$ particles/cm³.

The fine particles, which are the light emitters 15, are preferable to have the maximum particle diameter of 1 to 20 nm. It is because emission efficiency is particularly heightened in this case. In the invention, "maximum particle diameter" means the largest particle diameter among particle diameters of those observed in the case where a range of a 100 nm square of an arbitrary cross section of the carrier 7 is observed by TEM observation (it may be a cross-sectional view shown in FIG. 3 or a cross-sectional view vertical to paper). Further, in the invention, "particle diameter" means a length of the longest line where a plane image of a fine particle projected to a TEM photograph can include. The maximum particle diameter of the fine particles may be, for example, 1, 2, 3, 4, 5, 6, 7, 8, 9, 10, 12, 14, 16, 18 or 20 nm. The maximum particle diameter of the fine particles may be in a range between whichever two numerals exemplified above and may be whichever one numeral value or lower.

In the case where the light emitters 15 are fine particles containing GeO and $GeO_2$, if the sum of GeO and $GeO_2$ contained in the light emitters 15 is 100%, GeO can be preferably contained 10% or higher. It is because if the ratio of GeO is too low, emission may sometimes be impossible or emission intensity may become too low. The ratio of GeO may be, for example, 10, 20, 30, 40, 50, 60, 70, 80, 90, 95, 99 or 100%. The ratio of GeO may be in a range of whichever two numeral values exemplified herein.

A ratio of GeO to an entire germanium oxide (GeO$_2$+GeO) can be determined by measuring peak surface area $S_{GeO2}$ attributed to GeO$_2$ and peak surface area $S_{GeO}$ attributed to GeO in a spectrum near 3d peak of an XPS spectrum and calculating $S_{GeO}/(S_{GeO2}+S_{GeO})$. As an X-ray source for XPS measurement, for example, Al Kα-ray (1486.6 eV) made monochromatic can be employed. The peak attributed to GeO$_2$ and the peak attributed to GeO are overlapped in skirt parts; however Gauss fitting may be carried out as shown in FIG. 2 to separate a waveform of the peak attributed to GeO$_2$ and the peak attributed to GeO and thus the surface areas $S_{GeO2}$ and $S_{GeO}$ can be measured. Peak energies of GeO$_2$ and GeO are about 33.5 and 32 eV, respectively.

Incidentally, in a spectrum near 2p peak of Ge in the XPS spectrum, oxidation ratio of Ge can be determined by measuring peak surface area $S_{Ge}$ attributed to germanium (Ge) and peak surface area $S_{oxidizedGe}$ attributed to germanium oxide (GeO$_2$+GeO) and calculating $S_{GeO}/(S_{Ge}+S_{oxidizedGe})$. Further, an average value of an oxidation rate can be calculated in the same manner as in the calculation of the average value of the oxygen deficiency rate. The average value of the oxidation rate is not particularly limited; however it may be, for example, 1, 5, 10, 15, 20, 25, 30, 34.9, 35, 40, 45, 50, 55, 60, 60.1, 65, 70, 70.1, 75, 80, 85, 90, 95, 99 or 100%. The average value of the oxidation rate may be in a range between whichever two numeral values exemplified herein.

2-2. Emission Wavelength

The light emitting device 19 of this embodiment comprising the light emitters 15 containing GeO and GeO$_2$ has electroluminescence (EL) with a wavelength peak in a range of 340 to 440 (more strictly 350 to 430 nm, 360 to 420 nm, 370 to 410 nm, 380 to 400 nm, or 385 to 395 nm) in the case where a voltage is applied between electrodes.

2-3. Method for Using the Light Emitting Device

The light emitting device 19 can emit light by applying a negative voltage to the third electrode 17 and a positive voltage to the light transmitting electrode 16, and adjusting the fourth electrode 18 at a potential between the third electrode 17 and the light transmitting electrode 16, for example, earthing it.

An intensity of the voltage to be applied is not particularly limited if it is sufficient for applying an electric field to generate tunnel electric current between the third electrode 17 and the fourth electrode 18 and applying an electric field to supply hot electrons generated by the tunnel electric current to the carrier 14. For example, emission is carried out by applying a voltage of −10V to the third electrode 17 and a voltage of +25V to the light transmitting electrode 16 and earthing the fourth electrode 18.

In this connection, with respect to the light emitting device 19 of this embodiment, in addition to the emission by hot electrons, emission by FN tunneling may be included.

2-4. Method for Manufacturing the Light Emitting Device 2-4-1. Formation of First Electrode The first electrode 11 comprising the p-type semiconductor part 12 and the n-type semiconductor part 13 forming the pn-junction at least in an upper face is formed. A formation method is not particularly limited; however a mask with a desired from is formed on a p-type silicon substrate and phosphorus, which is an n-type impurity, is ion implanted and thereafter the mask is removed to form the first electrode 11 comprising the p-type silicon and the n-type silicon on the upper face.

2-4-2. Formation of Carrier

The light transmitting carrier 14 is formed on the first electrode 11. For example, it can be formed by depositing silicon oxide or silicon nitride is deposited by CVD or sputtering.

2-4-3. Formation of Light Emitters

The light emitters 15 are formed in the inside of the carrier 14. A method for forming the light emitters 15 in the inside of the carrier 14 is not particularly limited; however in the case where the light emitters 15 are fine particles containing GeO and GeO$_2$, it is supposed to be a method involving ion implanting germanium in the carrier 14 and thereafter carrying out a heat treatment. Ions are agglomerated by the heat treatment after ion implantation and a large number of fine particles are formed in the carrier 14 Ge is oxidized to form GeO and GeO$_2$. The germanium ion implantation may be carried out in conditions of, for example, implantation energy of 5 to 100 eV and implantation amount of $1\times10^{14}$ to $1\times10^{17}$ ions/cm$^2$.

A ratio of GeO and GeO$_2$ can properly be controlled by changing a germanium implantation amount, a heat treatment time, a heat treatment temperature, a heat treatment atmosphere and the like. Specifically, a ratio of GeO can be increased by controlling a partial pressure and flow rate of oxygen in the heat treatment atmosphere. For example, in the case where an atomic concentration of germanium in silicon oxide with a film thickness of 100 nm is 10% or lower, in a heat treatment at 800° C. for 1 hour, if an inert gas is supplied (50 ml/min) while vacuum evacuation is carried out (400 ml/min), although partially bonded with oxygen, germanium is not completely oxidized since oxygen is insufficient and GeO may be generated. In the atmosphere of 1 atm containing an inert gas mixed with 20% by volume of oxygen, oxygen supply is so much as to increase GeO$_2$ and decrease GeO. Although depending on other parameters such as germanium implantation conditions and a heat treatment time and temperature, an atmosphere proper for increasing a ratio of GeO can increase a rate of GeO, for example, by relatively increasing the atomic concentration of germanium and supplying an inert gas mixed with oxygen while vacuum evacuation is carried out.

Further, germanium is preferable to be added in a germanium concentration of 0.1 to 10.0% by atom in the carrier 14. It is because in a heat treatment at 600° C. for 1 hour, an inert gas is supplied (50 ml/min) while vacuum evacuation is carried out (400 ml/min) and, therefore, light emitting efficiency becomes relatively high in this range. The germanium concentration is specifically, for example, 0.1, 0.2, 0.3, 0.4, 0.5, 0.6, 0.7, 0.8, 0.9, 1.0, 2.0, 3.0, 4.0, 5.0, 6.0, 7.0, 8.0, 9.0 and 10.0% by atom. The concentration may be in a range between whichever two numeral values exemplified herein. The germanium concentration can be measured by, for example, high dissolution RBS (Rutherford Back Scattering) method and besides, it can be measured by various analysis methods such as SIMS (Secondary Ion Mass Spectroscopy). A germanium concentration measurement is carried out in a range of $\frac{1}{100}$ of peak value or higher of the germanium concentration. The heat treatment temperature is preferably 400 to 900° C. and more preferably 500 to 800° C. It is because if it is in this range, light emitting efficiency becomes relatively high.

2-4-4. Formation of Light Transmitting Electrode

The light transmitting electrode 16 is formed on the carrier 17 in which the light emitters 15 are formed. For example, in the case of an ITO electrode, it can be formed by a coating method, sputtering, or the like.

2-4-5. Formation of Third Electrode and Fourth Electrode

The third electrode 17 is formed on a surface of the p-type semiconductor part 12 and on a part of a surface where the carrier 14 is not formed. Further, the fourth electrode 18 is formed on a surface of the n-type semiconductor part and on a part of a surface where the carrier 14 is not formed. A formation method is not particularly limited; however, for example, the electrodes can be formed by a coating method, sputtering, or the like.

3-1. EL Experiment

An EL experiment was carried out by a following method to confirm Light frequency characteristics and causes of light emitted by the light emitting device in accordance with the invention.

First, a silicon substrate was heat oxidized at 1000° C. for 40 minutes in oxygen atmosphere to form a silicon heat oxidized film on a surface thereof.

Next, Ge ions were multiply-implanted in the silicon heat oxidized film in condition of $6.0\times10^{15}$ ions/cm$^2$ at 50 keV, $2.0\times10^{15}$ ions/cm$^2$ at 20 keV, and $9.0\times10^{14}$ ions/cm$^2$ at 10 keV in this order.

Next, while evacuation was carried out by a rotary pump, nitrogen was introduced and heat treatment was carried out at heat treatment temperatures properly changed for respective devices. During the heat treatment, Ge was oxidized by agglomeration and oxidation of the implanted Ge to form GeO at least.

Next, an ITO electrode was formed on the silicon heat-oxidized film and an aluminum electrode was formed in a silicon substrate side to obtain a plurality of light emitting device to be used for the EL experiment.

When an AC voltage (sinusoidal waveform, 60 Vp-p, 1 kHz) was applied between the ITO electrode and the aluminum electrode of this light emitting device, blue emission was observed.

Figure 6:
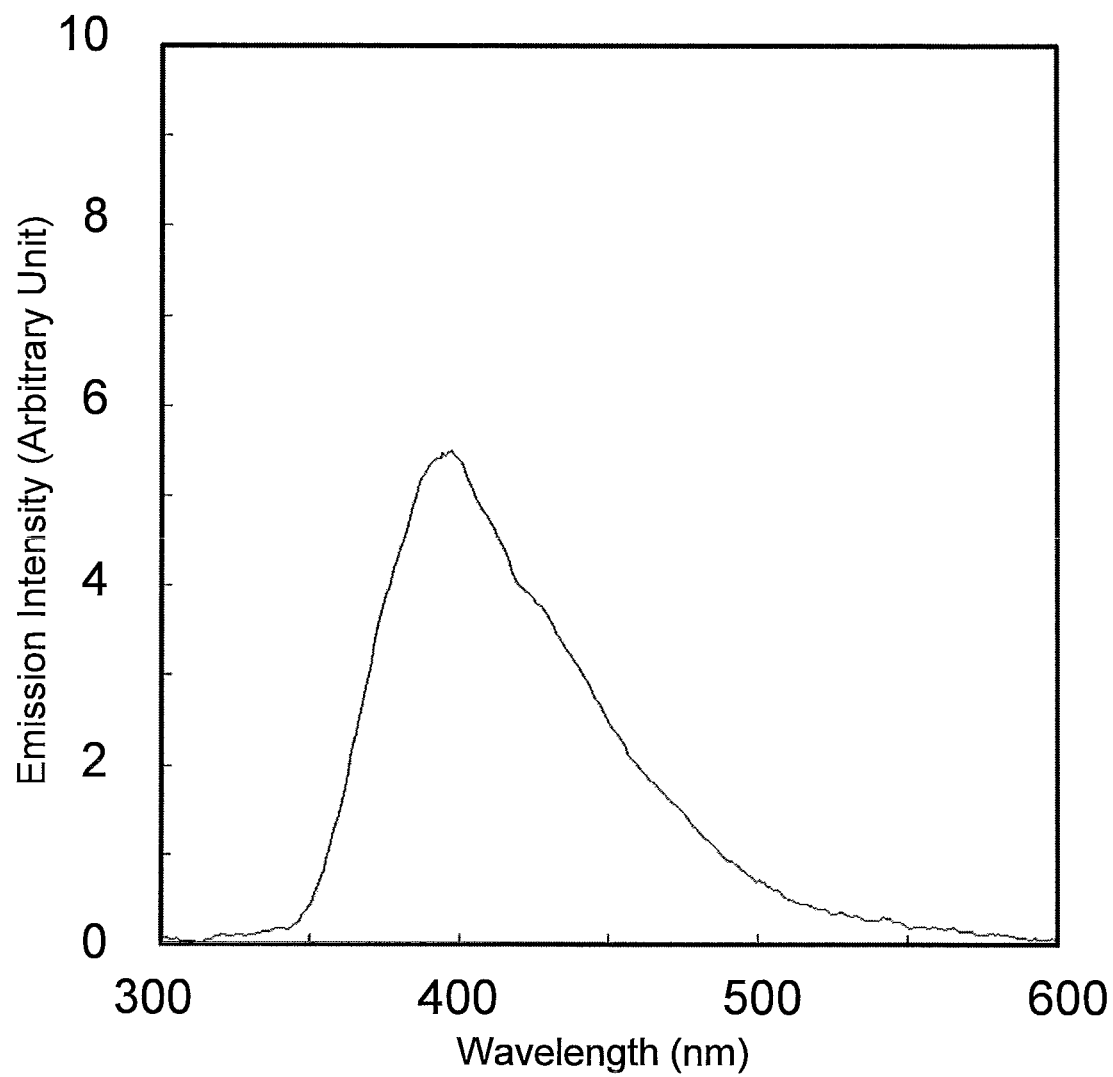
FIG. 6 is a graph showing an emission spectrum of a light emitting device manufactured to confirm light frequency characteristics emitted by a light emitting device in accordance with an embodiment of the invention.

Further, an emission spectrum of the blue emission is shown in FIG. 6. With reference to FIG. 6, the observed blue emission was found electroluminescent light with a wavelength from 300 nm to 550 nm and having a peak between 350 nm to 500 nm.

Furthermore, when a DC voltage was applied in place of the AC voltage, emission was confirmed at 50V and emission intensity was also found similar.

Next, after the projections of silicon are formed on a silicon substrate by the method employing etching, additionally, a silicon oxide film is formed and a light emitting device is manufactured in the same steps as those described above and an EL experiment is carried out. As a result, a DC voltage necessary for emission is about 50% at maximum and is thus lowered. Further, evenness of luminance in a light emitting region is also improved.

Further, conventional EL devices using ZnS fine particles on a silicon substrate are manufactured and the same EL experiment is carried out. When devices in which the projections are formed and devices in which no projections are formed are compared to find that an AC voltage necessary for emission for the devices in which the projections are formed is lowered by about 10% than the devices in which no projections are formed.

As described, it is confirmed that the invention can suppress the unevenness of emission and lower the operation voltage.

3-2. Relation of GeO and GeO$_2$ and Emission

It was confirmed that GeO and GeO$_2$ were involved in emission of the light emitting device of the invention by a following method. First, in the same process as that in the embodiment, a sample was manufactured. In this connection, an atmosphere in an annealing step was changed to be hydrogen. A furnace inside and a pipeline of an annealing furnace were sufficiently vacuum evacuated and subjected to replacement to sufficiently suppress the remaining oxygen.

Besides, an EL experiment was carried out in the same manner to find that emission intensity was weak. It is supposed the following: that is, in annealing in nitrogen, oxidation is carried out by oxygen isolated from SiO$_2$ during Ge implantation or remaining oxygen in supplied nitrogen or in a furnace; however oxygen contributing to oxidation of Ge is little in the case of annealing in hydrogen in this experiment and oxidized Ge is reduced by hydrogen and thus Ge is scarcely oxidized.

Accordingly, it was confirmed that GeO and GeO$_2$ were involved in emission of the light emitting device of the invention.

Next, light emitting devices were manufactured in various and different temperature conditions and implantation conditions different from each other and an EL wavelength was measured. The EL wavelength measurement was carried out by reforming a spectrophotofluorometer RF-5300 PC manufactured by Shimadzu Corporation. A method for manufacturing light emitting devices was as described in "3-1. EL experiment", except the heat treatment temperature and the Ge implantation amount were properly changed.

Figure 7:
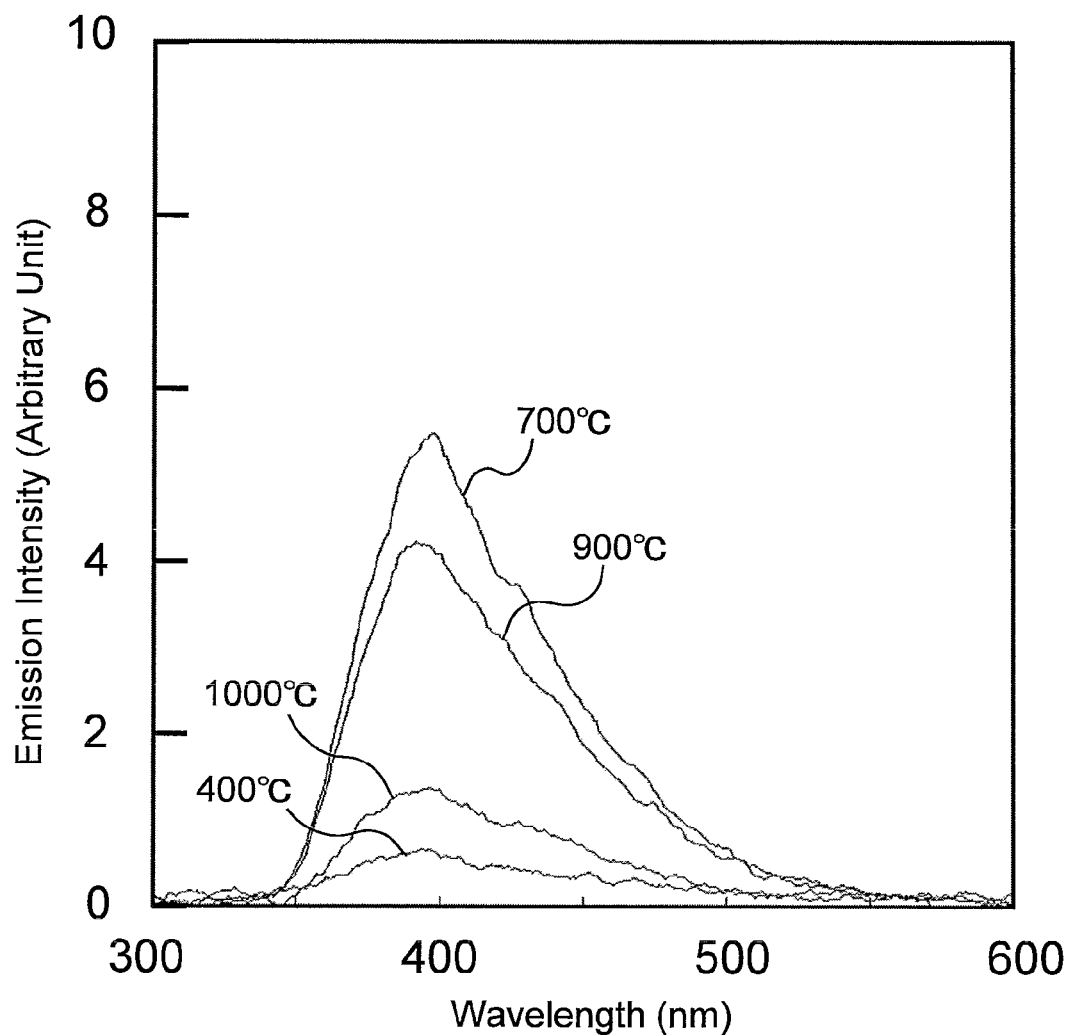
FIG. 7 is a graph showing emission spectra of a light emitting device manufactured to confirm light frequency characteristics emitted by a light emitting device in accordance with an embodiment of the invention.
Figure 8:
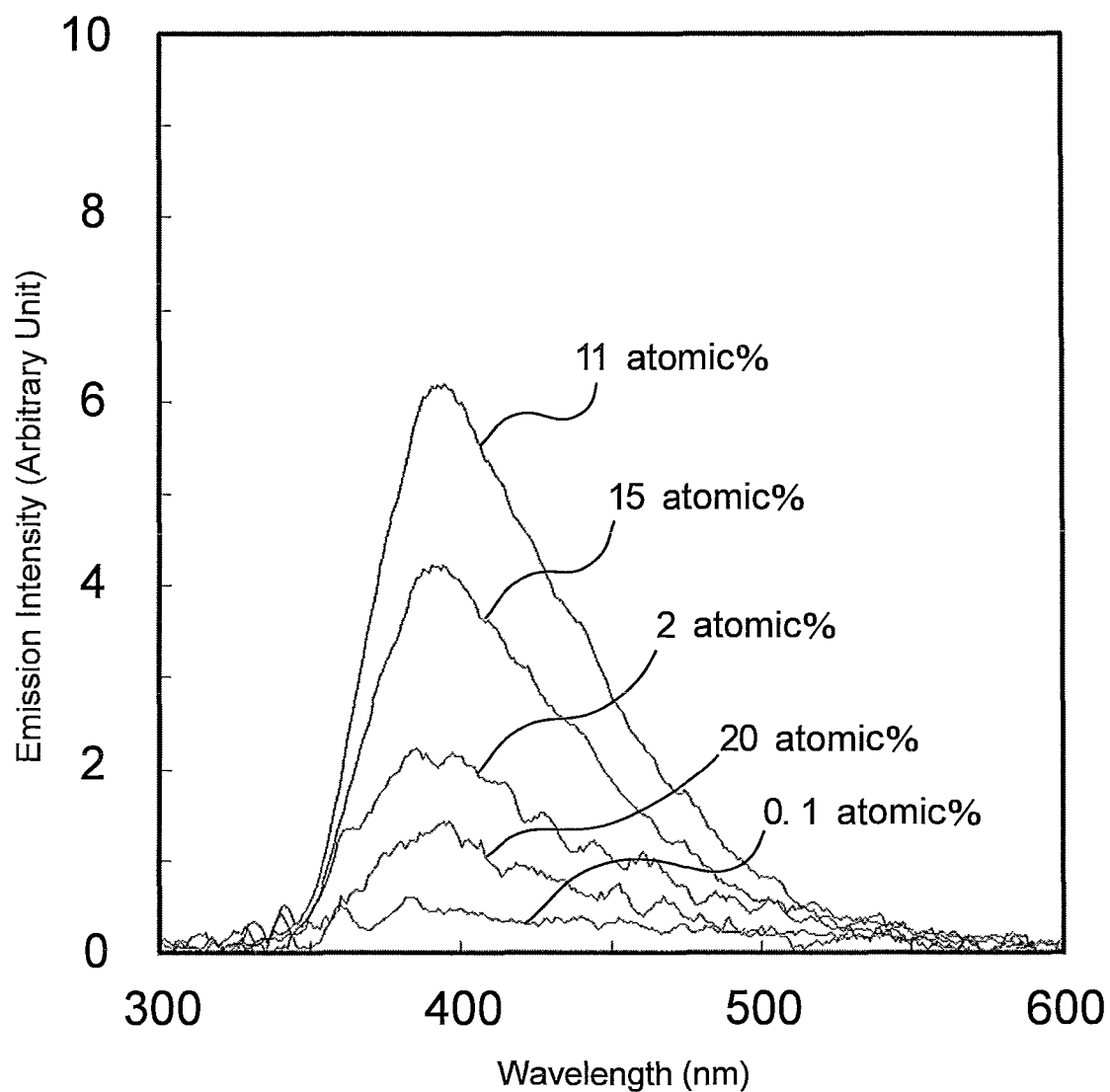
FIG. 8 is a graph showing emission spectra of a light emitting device manufactured to confirm light frequency characteristics emitted by a light emitting device in accordance with an embodiment of the invention.

Obtained results are shown in FIG. 7 and FIG. 8. A temperature in FIG. 7 shows a heat treatment temperature (heating time was 1 hour). "% by atom" in FIG. 8 shows a Ge concentration in a silicon heat oxidized film after Ge implantation. This Ge concentration was measured by Rutherford back scattering method using HRBS 500 manufactured by Kobe Steel, Ltd. Specifically, He ion beam was radiated at 450 keV and recoil particles were analyzed by using a magnetic field type energy analyzer. A depth distribution of germanium atoms in the silicon oxide film can be measured based on scattering from silicon atoms in the silicon oxide film. In this experiment, calculation was made while densities of the silicon oxide film and silicon were assumed to be 2.2 and 2.33 g/cm$^3$, respectively. The Ge concentration in FIG. 7 is 5% by atom and the heat treatment temperature in FIG. 8 is 800° C. (heating time is 1 hour).

With reference to FIG. 7 and FIG. 8, it can be understood that even if the heat treatment temperature and the Ge concentration are changed, a peak wavelength of EL is approximately constant and about 400 nm.

Incidentally, with reference to FIG. 7, it can be understood that the heat treatment temperature is preferably 400 to 1000° C. and more preferably 700 to 900° C. Further, with reference to FIG. 8, it can be understood that the Ge concentration is preferably 0.1 to 20% by atom and more preferably 2 to 11% by atom.

3-3. Distribution of Ratios of Ge, GeO, GeO$_2$ in Depth Direction

Light emitting devices were manufactured in accordance with the method described in "3-1. EL experiment" and distribution of ratios of Ge, GeO, GeO$_2$ in the depth direction in a silicon heat oxidized film was investigated. A Ge concentration in the light emitting devices manufactured was 5% by atom and a heat treatment temperature was 800° C. (heating time was 1 hour).

Since XPS can generally analyze a range from a specimen surface to a depth of several nm, etching by argon ion beam and XPS measurement were carried out alternately to investigate a change of ratios of Ge, GeO, GeO$_2$ in the depth direction in a region to a depth of 50 nm. An energy of the argon ion beam was 4 kV and beam current was 15 mA and radiation was carried out for 300 seconds in each time. FIG.

Figure 9A:
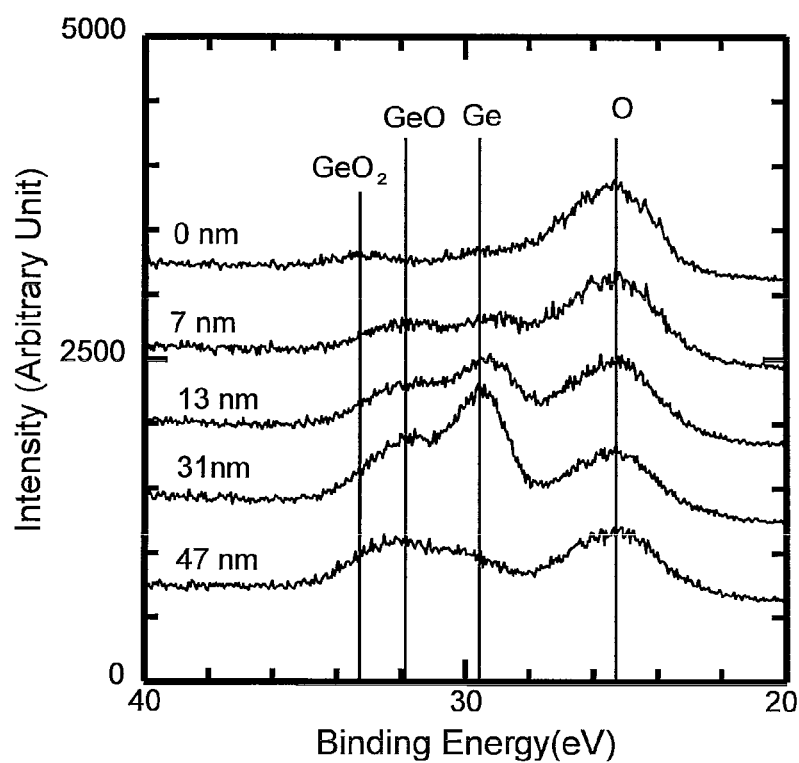
FIG. 9A is a graph showing XPS spectra of a light emitting device manufactured to confirm causes of light emitted by a light emitting device in accordance with an embodiment of the invention.
Figure 9B:
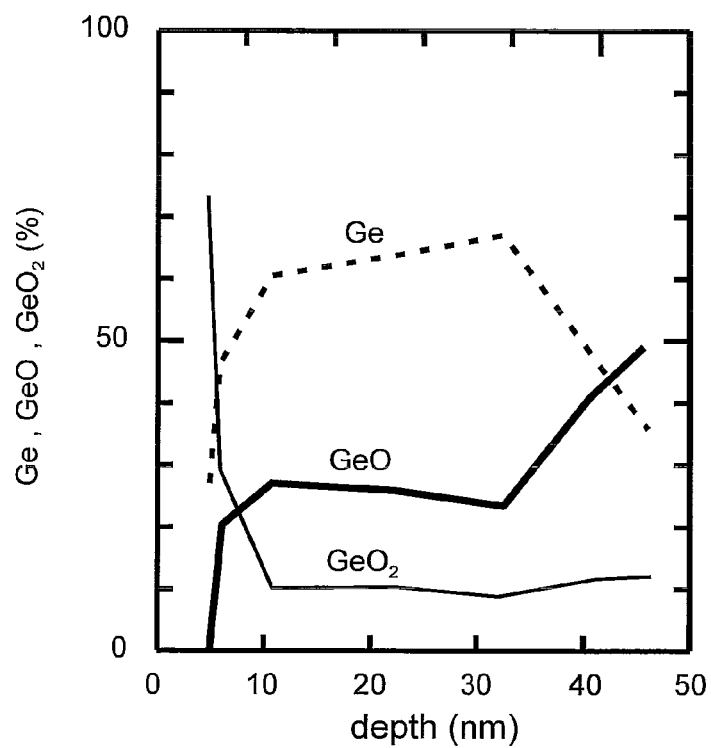
FIG. 9B shows a graph of depth of the carrier versus the ratios of Ge(metal Ge), GeO and $GeO_2$ of a light emitting device manufactured to confirm causes of light emitted by a light emitting device in accordance with an embodiment of the invention.

9A shows a graph of XPS measurement results at that time in relation to respective depths, which are arranged while being shifted in parallel in the vertical direction for easy understanding. FIG. 9B shows a graph of states of Ge atoms contained in the respective depths based on the ratios of Ge (metal Ge), GeO, $GeO_2$.

According to the graphs, in a region of 10 to 50 nm depth where an implantation concentration of Ge implanted by the implantation method described in "3-1. EL experiment" is relatively high, a ratio of unoxidized Ge is 30 to 70%. A ratio of $GeO_2$ is between 0 to 20% and about 10%. A ratio of GeO in which Ge is not completely oxidized but partially oxidized is between 10 to 50%.

Figure 10:
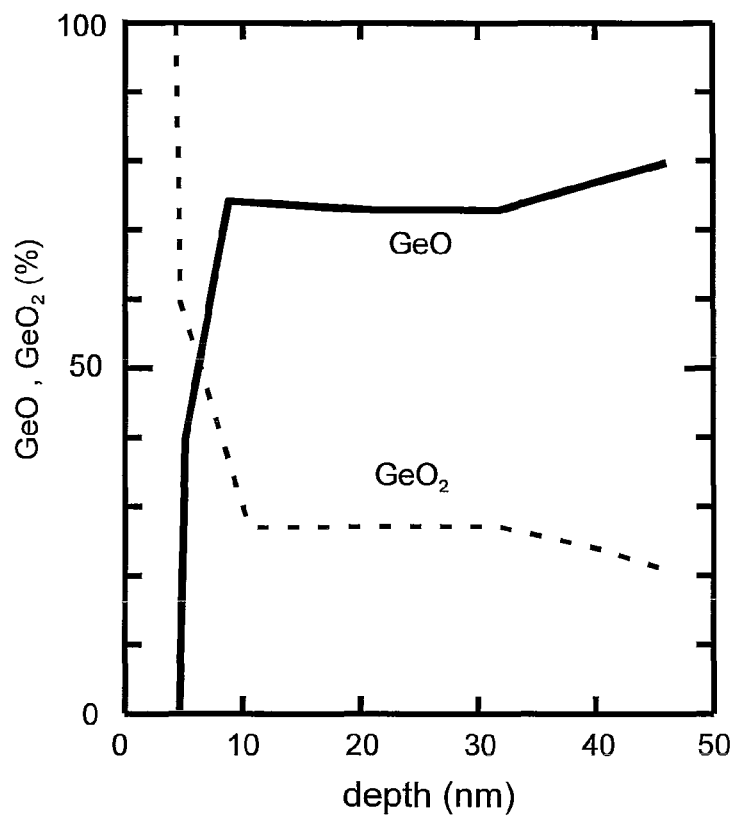
FIG. 10 shows a graph of depth of the carrier versus the ratios between GeO and $GeO_2$ of a light emitting device manufactured to confirm causes of light emitted by a light emitting device in accordance with an embodiment of the invention.

The ratios of Ge, GeO, $GeO_2$ in respective depths were determined by measuring surface area $S_{Ge}$ of a peak attributed to Ge, surface area $S_{GeO}$ of a peak attributed to GeO, and surface area $S_{GeO2}$ of a peak attributed to $GeO_2$ in an XPS spectrum near 3d peak of a Ge spectrum and calculating $(S_{Ge}, S_{GeO}, S_{GeO2})/(S_{Ge}+S_{GeO}+S_{GeO2})$ for the respective depths. Further, ratios of GeO and $GeO_2$ to an entire germanium oxide ($GeO_2$+GeO) are shown in a graph in FIG. 10.

According to the graph, a ratio of completely oxidized $GeO_2$ in germanium oxide is around 20 to 60% except in a surface periphery where a germanium concentration is low and germanium is strongly affected with an atmosphere and easy to be oxidized completely and a ratio of GeO in which Ge is not completely oxidized but partially oxidized is around 40 to 80%. In a region of 10 to 40 nm depth where an implantation concentration of Ge implanted by the implantation method described in "3-1. EL experiment" is relatively high, a ratio of $GeO_2$ in which Ge in completely oxidized in germanium oxide is about 50% or lower and about 20 to 30%. A ratio of GeO in which Ge is not completely oxidized but partially oxidized is 50% or higher and about 70 to 80%. The ratios of GeO and $GeO_2$ in respective depths were determined by measuring the surface area $S_{GeO}$ of the peak attributed to GeO and the surface area $S_{GeO2}$ of the peak attributed to $GeO_2$ in the XPS spectrum near 3d peak of the Ge spectrum and calculating the $(S_{GeO}, S_{GeO2})/(S_{GeO}+S_{GeO2})$ for the respective depths. The XPS spectrum was measured using Al Kα-ray (1486.6 eV) made monochromatic as an X-ray source.

What is claimed is:

1. A light emitting device comprising:
a first electrode;
a second electrode being light transmitting; and
a carrier sandwiched between the first electrode and the second electrode, and containing light emitters,
wherein the light emitters are fine particles containing GeO and $GeO_2$, and
wherein the first electrode has a plurality of projections or a pn junction formed with a p-type semiconductor and an n-type semiconductor each on a surface being in contact with the carrier.

2. A light emitting device comprising:
a first electrode;
a second electrode being light transmitting;
a carrier sandwiched between the first electrode and the second electrode, and containing light emitters;
wherein the light emitters are fine particles containing GeO and $GeO_2$,
wherein the first electrode has a pn junction formed with a p-type semiconductor and an n-type semiconductor on a surface being in contact with the carrier, and
the first electrode is constituted with a p-type semiconductor part and a n-type semiconductor part both having a pn-junction at least on a surface being in contact with the carrier,
a third electrode formed on the p-type semiconductor part and parts without the carrier thereon; and
a fourth electrode formed on the n-type semiconductor part and parts without the carrier thereon.

3. The device according to claim 2, wherein the light emitters are fine particles of which maximum particle diameter is of 1 nm to 20 nm.

4. The device according to claim 2, wherein the light emitters provide electroluminescence having a peak wavelength in the range of 350 to 500 nm when a voltage is applied to the carrier between the first electrode and the second electrode.

5. The device according to claim 2, wherein the light emitters are fine particles containing GeO and $GeO_2$, and the light emitters contain GeO having 10% or more in the case where the entire germanium oxide contained in the light emitters is determined to be 100%.

6. The device according to claim 2, wherein the carrier is made of an insulator.

7. The device according to claim 2, wherein the carrier is made of silicon oxide, silicon nitride, or silicon oxynitride.

8. The device according to claim 2, wherein the second electrode has a transmittance of light with a wavelength of 300 nm or longer and 500 nm or shorter, and the transmittance being of 60% or higher and 99.99% or lower.

9. The device according to claim 2, wherein the second electrode is made of a metal oxide thin film, a metal thin film, or a semiconductor thin film.

10. The device according to claim 2, wherein the pn-junction formed with the p-type semiconductor part and the n-type semiconductor part is formed at constant intervals on the surface of the first electrode being in contact with the carrier.

11. The device according to claim 2, wherein the pn-junction formed with the p-type semiconductor part and the n-type semiconductor part is evenly formed on the surface of the first electrode being in contact with the carrier.

12. The device according to claim 2, wherein at least one of the p-type semiconductor part and the n-type semiconductor part has an impurity concentration of $5 \times 10^{18}/cm^3$ or more.

13. The device according to claim 2, wherein the p-type semiconductor part and the n-type semiconductor part are made of silicon as the principal constituent.

14. The device according to claim 2, wherein the device emits light by applying a negative voltage to the third electrode, a positive voltage to the fourth electrode, and a positive or negative voltage to the second electrode.

15. The device according to claim 2, wherein the device emits electroluminescence with a wavelength peak in a range of 340 to 440 nm by applying a negative voltage to the third electrode, a positive voltage to the fourth electrode, and a positive or negative voltage to the second electrode.

* * * * *